United States Patent
Marshall

(10) Patent No.: US 10,445,053 B2
(45) Date of Patent: Oct. 15, 2019

(54) PROCESSING AUDIO SIGNALS

(71) Applicant: Red Lion 49 Limited, Kidlington Oxford, Oxfordshire (GB)

(72) Inventor: Andrew Ashley Marshall, Bicester (GB)

(73) Assignee: Red Lion 49 Limited, Begbroke, Kidlington Oxford, Oxfordshire (GB)

(*) Notice: Subject to any disclaimer, the term of this patent is extended or adjusted under 35 U.S.C. 154(b) by 13 days.

(21) Appl. No.: 15/863,008

(22) Filed: Jan. 5, 2018

(65) Prior Publication Data

US 2018/0196631 A1 Jul. 12, 2018

(30) Foreign Application Priority Data

Jan. 6, 2017 (GB) .................................. 1700209.8

(51) Int. Cl.
*G06F 17/00* (2019.01)
*G06F 3/16* (2006.01)
*H03G 3/30* (2006.01)
*H04H 60/04* (2008.01)

(52) U.S. Cl.
CPC .............. *G06F 3/162* (2013.01); *G06F 3/165* (2013.01); *H03G 3/3005* (2013.01); *H04H 60/04* (2013.01)

(58) Field of Classification Search
CPC ....... G06F 3/162; G06F 3/165; H03G 3/3005; H04H 60/04; G10H 1/0058; G10H 2240/301; H04J 3/1605; H04R 2227/003
See application file for complete search history.

(56) References Cited

U.S. PATENT DOCUMENTS

| 5,864,747 A | 1/1999 | Clark et al. |
| 2003/0223409 A1 | 12/2003 | Wiebe |
| 2008/0175413 A1* | 7/2008 | Okabayashi .......... H04L 67/125 381/119 |
| 2009/0192639 A1* | 7/2009 | Cellier ...................... G06F 9/52 700/94 |
| 2013/0089026 A1* | 4/2013 | Piper ....................... H04W 4/00 370/328 |

FOREIGN PATENT DOCUMENTS

| GB | 2276796 A | 10/1994 |
| WO | 2008/003588 A1 | 1/2008 |
| WO | 2011/098142 A1 | 8/2011 |

* cited by examiner

*Primary Examiner* — Md S Elahee
*Assistant Examiner* — David Siegel
(74) *Attorney, Agent, or Firm* — Richard M. Goldberg

(57) ABSTRACT

Audio signals are processed by a real-time digital-signal-processing system. A digital-audio-interface is arranged to be connected to a packet-based-network. A control-processor arranged presents a graphical-interface to a user and an audio-source is connected to the packet-based-network. The control-processor receives an instruction to connect the external-audio-source to the digital-signal-processing system via the packet-based-network. In response to receiving the instruction, the control-processor establishes a first-connection-node between the audio-source and the packet-based-network; creates a second-connection-node between the packet-based-network and the digital-audio-interface; and configures a third-connection-node between the digital-audio-interface and the digital-signal-processing system.

19 Claims, 10 Drawing Sheets

| EXTERNAL DEVICE | CONTROLS | |
| --- | --- | --- |
| MIC 1 | HI | 48v |
| MIC 2 | HI | 48v |
| MIC 3 | LO | 0 |
| MIC 4 | LO | 0 |
| MIC 5 | LO | 0 |
| MIC 6 | LO | 0 |
| MIC 7 | LO | 0 |
| MIC 8 | LO | 0 |
| PHONES 1 | | |
| PHONES 2 | | |
| PHONES 3 | | |
| PHONES 4 | | |
| PHONES 5 | | |
| PHONES 6 | | |
| PHONES 7 | | |
| PHONES 8 | | |

*Fig. 7*

| ADDRESS | DEVICE | CONNECTED |
|---|---|---|
| 0001 | | YES |
| 0002 | | YES |
| 0003 | | YES |
| 0004 | | YES |
| 0005 | | YES |
| 0006 | | YES |
| 0007 | | YES |
| 0008 | MIC 1 | YES |
| 0009 | PHONES 1 | YES |
| 0010 | | NO |
| 0011 | | NO |
| 0012 | | NO |
| 0013 | | NO |
| 0014 | | NO |
| 0015 | | NO |
| 0016 | | NO |

Fig. 8

| NODZ TDM SLOT | ADDRESS |
|---|---|
| 001 | IN USE |
| 002 | IN USE |
| 003 | 0008 |
| 004 | |
| ⋮ | |
| 256 | |
| 255 | |
| | |

Fig. 9

PROCESSING AUDIO SIGNALS

CROSS REFERENCE TO RELATED APPLICATIONS

The present application claims priority from British patent application No 1700209.8, filed Jan. 6, 2017, the entire contents of which are incorporated herein by reference.

BACKGROUND OF THE INVENTION

The present invention relates to a machine for processing audio signals, a process of processing audio signals and a manufacture of an audio environment.

Digital audio consoles are known in which audio signals are processed as digital signals. Consoles of this type follow a format that is similar to conventional analog consoles in that each input signal has a dedicated channel, usually including a fader and other processor controls.

Within the console, synchronisation of signals is maintained and digital-input-signals may be received as a time-division-multiplex. Thus, each digital signal is contained within a time-slot of the multiplex and specific time slots are then allocated to channels within the console environment.

In many applications, including those deployed within broadcasting environments, it is necessary to maintain real-time operation, such that any latency introduced through the process of digitization is minimised and operations are perceived by users as being instantaneous. To achieve this, the mixing-console includes a digital-processing-system operating in real-time that is dedicated to the processing of signals received within particular channels. Such systems cannot be interrupted and as such are not available for providing additional control functions.

It is also appreciated that in many environments, it is necessary to transmit audio signals over significant distances between their source and a mixing and processing environment. To achieve this, it is known to transmit audio signals over conventional packet-based networks, such as Ethernet. It is also known to provide bridges allowing a packet-based environment to interface with a time-division-multiplex environment, thereby maintaining communication between an audio-source and a mixing-console. However, it is well established that significant configuration operations are required in order to establish an environment of this type. This requires trained engineers and as such may present a significant overhead, particularly if the environment is portable or requires reconfiguration on a regular basis. From a user's perspective, they merely wish to identify a particular source, such as a particular microphone, as providing an input to a particular channel on a mixing-console, without being required to specifically program a packet-based environment such that it may interface with a time-division-multiplex environment.

BRIEF SUMMARY OF THE INVENTION

The present invention provides a machine for processing audio signals, comprising: a real-time digital-signal-processing-system; a digital-audio-interface arranged to be connected to a packet-based-network; a control-processor arranged to present a graphical-interface to a user; and an audio-source connected to said packet-based-network. The control-processor is configured to receive an instruction to connect said external-audio-source to said digital-signal-processing-system via said packet-based-network. In response to receiving said instruction, said control-processor is arranged to: establish a first-connection-node between said audio-source and said packet-based-network; create a second-connection-node between said packet-based-network and said digital-audio-interface; and configure a third-connection-node between said digital-audio-interface and said digital-signal-processing-system.

In this way, the control-processor allows connections to be made dynamically in response to a single command generated by the graphical-interface. Thus, a user may identify a connection from a particular microphone to a particular channel of a mixing-console, whereafter the control system is arranged to establish a communications path, by defining the way in which particular nodes operate and then in turn communicate with each other.

BRIEF DESCRIPTION OF THE SEVERAL VIEWS OF THE DRAWINGS

FIG. 7 shows a first-table;

FIG. 8 shows a second-table;

FIG. 9 shows a third-table; and

DETAILED DESCRIPTION OF EMBODIMENTS OF THE INVENTION

FIG. 1

Figure 1:
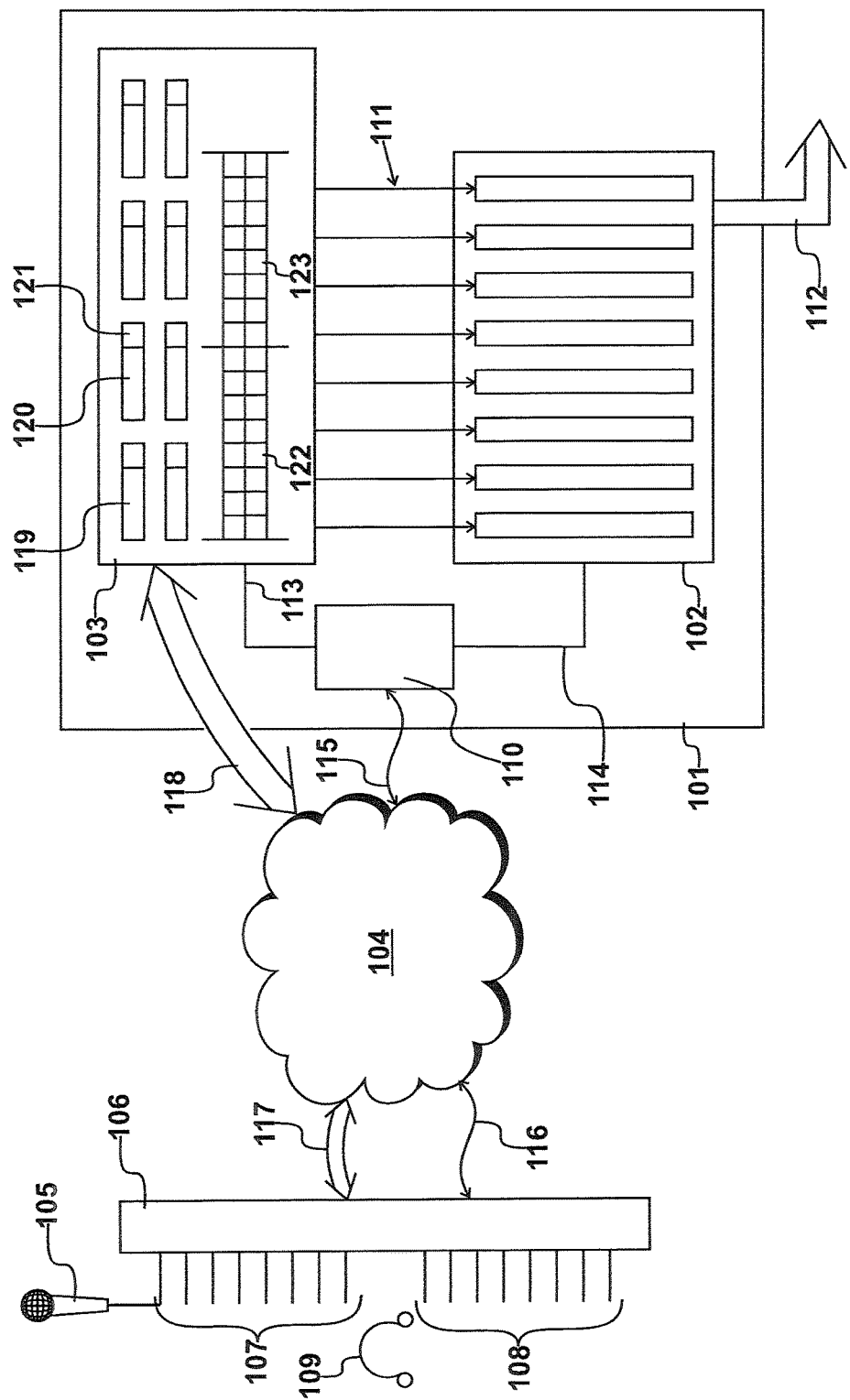
FIG. 1 shows an environment for processing audio signals.

An environment for processing audio signals is illustrated in FIG. 1. An audio processing apparatus is provided which, in this embodiment, is implemented as a mixing-console 101. The mixing-console 101 includes a real-time digital-signal-processing-system 102 that is arranged to receive multiple digital audio signal inputs that are synchronised and may in turn have been received from a time-division-multiplex. In an embodiment, the mixing-console 101 may receive direct digital inputs of this type possibly from local analog to digital converters.

In the embodiment of FIG. 1, the mixing-console 101 includes a digital-audio-interface 103 connected to a packet-based-network 104. An audio-source 105 also provides audio signals to the packet-based-network 104 via an audio-digitising-system 106. Thus, the audio-digitizing-system 106 is arranged to receive analog audio input signals, digitize these signals using an analog-to-digital converter and then transmit packets of audio data to the packet-based-network 104.

In the embodiment of FIG. 1, additional analog audio inputs 107 are provided. The audio-digitizing-system 106 may be implemented as an internet protocol stage box and the packet-based-network 104 may operate in accordance with established Ethernet protocols. In this example, the audio-digitizing-system 106 has eight audio-inputs 107, along with eight audio-outputs 108. One of these outputs is connected to headphones 109 to provide foldback to talent making use of audio-source 105.

The packet-based-network 104 could be a relatively small network or could be much larger, possibly having thousands of connections. The invention seeks to connect the audio signals passing through the audio-digitizing-system to digital channels within the digital-signal-processing-system 102, with minimal intervention on the part of an operative.

To achieve the specified objectives, an aspect of the invention provides a control-processor 110. The control-processor 110 is configured to receive an instruction from an operative to connect the external audio-source 105 to the digital-signal-processing-system 102 via the packet-based-network 104. In response to receiving this instruction, the control-processor 110 establishes a first-connection-node between the audio-source 105 and packet-based-network 104. In addition, the control-processor 110 creates a second-connection-node between the packet-based-network 104 and the digital-audio-interface 103. Finally, the control-processor 110 configures a third-connection-node between the digital-audio-interface 103 and the digital-signal-processing-system 102.

In an embodiment, the digital-signal-processing-system 102 is implemented on a programmable system running a real-time operating system. In this way, the digital-signal-processing-system 102 is optimised for performing a substantial degree of calculation within the digital domain in order to perform the required digital-signal-processing operations. Furthermore, the digital-signal-processing-system 102 is optimised to operate in real-time, thereby avoiding the introduction of noticeable latency. Thus, when operating in this way, resources are not available for providing additional control functions, thereby ensuring that the core activities are not in any way delayed while attempting to services interrupts and presenting what is often perceived as a multitasking environment.

In an embodiment, the control-processor 110 is implemented as a completely separate computer system which, although housed, in an embodiment, within the overall mixing-console 101, implements a completely separate processing environment. The processing environment of the control-processor 110 is not constrained to operate within a real-time environment and as such may be implemented using standard operating systems that, as is known in the art, are available to service user input commands and other activities within the overall control regime.

As illustrated in FIG. 1, the digital-signal-processing-system 102 defines a plurality of individually controllable audio-channels and the third-connection-node is configured to identify a specific one of these audio-channels. Thus, when audio data is presented to the digital-signal-processing-system 102 in this way, it is possible for the system to perform as an audio mixing-console by processing, routing and mixing the audio signals to provide audio-outputs as illustrated by an audio-output-port 112.

The control-processor 110 provides control commands to the digital-audio-interface 103 via a first-control-line 113. Similarly, the control-processor 110 provides control signals to the digital-signal-processing-system 102 via a second-control-line 114. A third-control-line 115 from the control-processor 110 adopts network protocols such that it reappears as a fourth-control-line 116 for controlling the audio-digitizing-system 106. These control lines allow the first-connection-node to be established, the second-connection-node to be created and the third-connection-node to be configured. It is also noted that the bandwidth requirements for the third-control-line 115 and the fourth-control-line 116 are relatively modest.

A substantially higher bandwidth connection is required for a first-data-line 117 and a second-data-line 118. The first-data-line 117 provides communication in the form of audio-data-packets between the audio-digitizing-system 106 and the packet-based-network 104. Similarly, the second-date-line 118 provides communication between the packet-based-network 104 and the digital-audio-interface 103.

When data is transmitted over the second-data-line 118 to the digital-audio-interface 103, packets of data, such as a first-data-packet 119 are received at the digital-audio-interface 103. Each data-packet includes a data-portion 120 and an address-portion 121. In accordance with an aspect of the present invention, the data-portions will have been produced by the audio-source 105 and the address-portions will have been allocated by the control-processor 110.

The purpose of the digital-audio-interface 103 is to convert this packet-based data into a time-division-multiplex, as illustrated by a first-data-block 122 and a second-data-block 123.

The data-packets may arrive at the digital-audio-interface in any order and their destination is identified by the allocated address-portion 121. At the digital-audio-interface, the individual data-portions are reassigned to a specific time-division slot within each data-block. Data from the data-blocks are then synchronously conveyed to the audio-channels 111, such that the digital-signal-processing-system 102 receives the digital data to allow synchronous and efficient data processing, thereby making optimised use of the available processing capability.

Thus, in operation, an instruction identifies a particular audio-source, such as audio-source 105 and selects a specific audio-channel 111 of the mixing-console. The digital-audio-interface 103 receives data-packets from many sources, with each source appending a respective packet-address to each transmitted data-packet; each packet therefore comprising a data-portion 120 and an address-portion 121. Each packet with a similar packet-address is then located within a respective time-slot following the creation of a respective second-connection-node.

The control-processor 110 identifies a first-packet address when a first-connection-node is established. The control-processor is configured to relay details of the first-packet address to the digital-audio-interface 103 during the creation of the second-connection-node.

The system of FIG. 1 has been described with reference to audio transmissions into the mixing-console 101. In an embodiment, transmission is also possible in the reverse direction using the second-data-line 118 and the first-data-line 117. Thus, in this way, audio signals may be returned to the audio-outputs 108.

Furthermore, in an embodiment, the control-processor 110 maintains details of audio-source functionality. In use, records are established of current audio connections and control signals are conveyed to the audio-sources from the control environment.

FIG. 2

Figure 2:
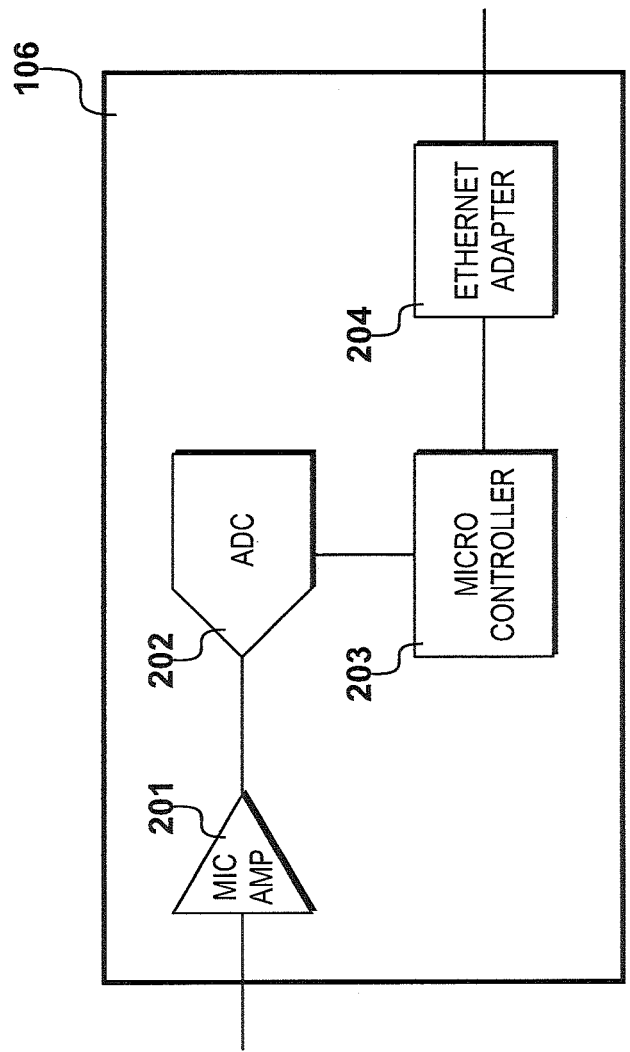
FIG. 2 shows an example of an audio-digitising-system, identified in FIG. 1.

An example of an audio-digitizing-system 106 is shown in FIG. 2. Analog inputs are supplied to a microphone-amplifier 201 and outputs from the microphone-amplifier 201 are conveyed to an input-digital-to-analog-convertor 202. In an embodiment, the input-digital-to-analog-convertor 202 converts the analog audio into digital samples at ninety-six kilohertz with a bit depth of twenty-four bits.

An input-microcontroller 203 is configured to encapsulate the digital samples into a data-stream of packets that are suitable for distribution over the packet-based-network 104. The input-microcontroller 203 interfaces with the packet-based-network 104, using an Ethernet-adapter 204 adopting established audio over Internet protocol techniques.

FIG. 3

Figure 3:
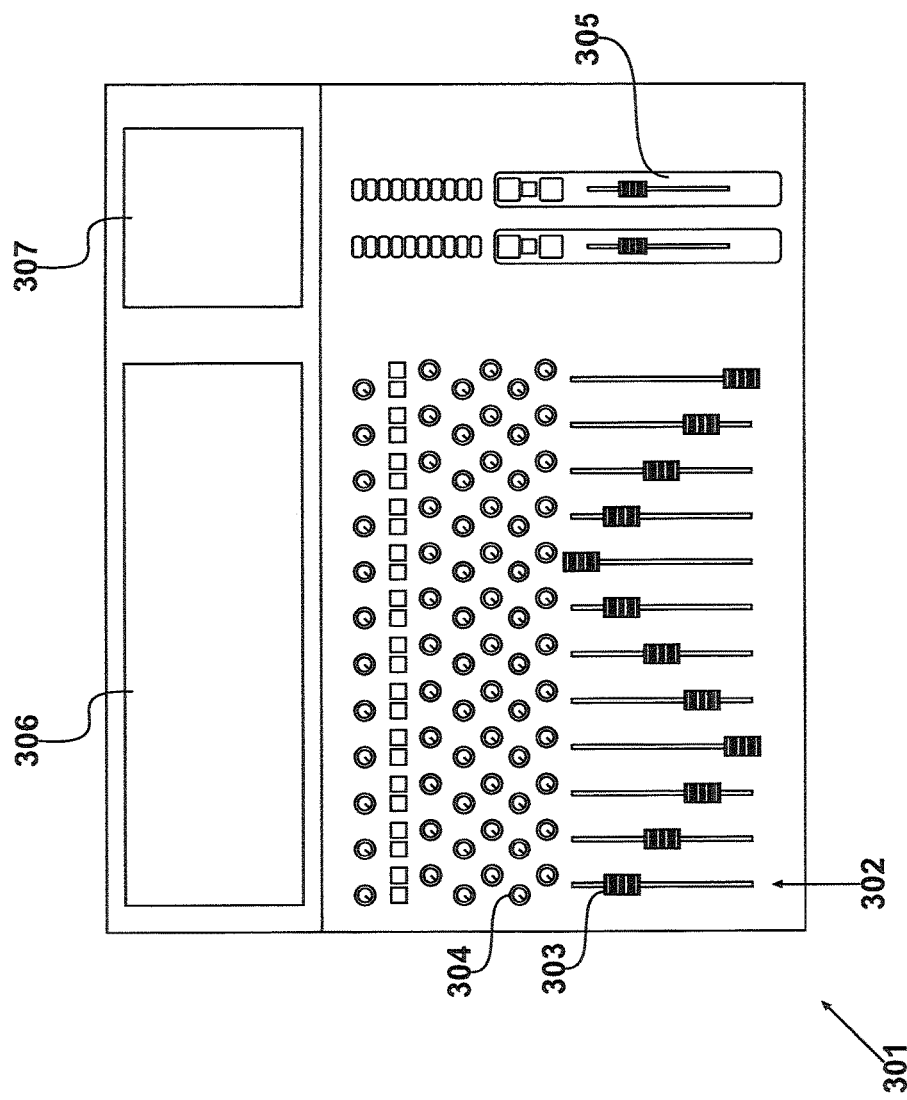
FIG. 3 shows an external view of a mixing-console identified in FIG. 1.

An external view of the mixing-console 101 is illustrated in FIG. 3. The mixing-console 101 has a control-surface 301, consisting of a plurality of channel-strips 302. Each channel-strip includes a fader 303 and rotary-controls 304 for adjusting parameters such as gain and equalisation etc.

The mixing-console 101 has capacity to receive many more channels of audio than there are channel-strips. Consequently, it is possible to assign multiple input channels to each channel-strip with an operator switching between channels in order to configure them. Master-output-controls 305 are also provided.

The mixing-console 101 includes a first-touch-screen 306 that is also used to identify and control parameters when the digital-signal-processing-environment of the console itself. In addition, a second-touch-screen 307 is provided to establish connections to external equipment, as required by an embodiment of the present invention.

FIG. 4

Figure 4:
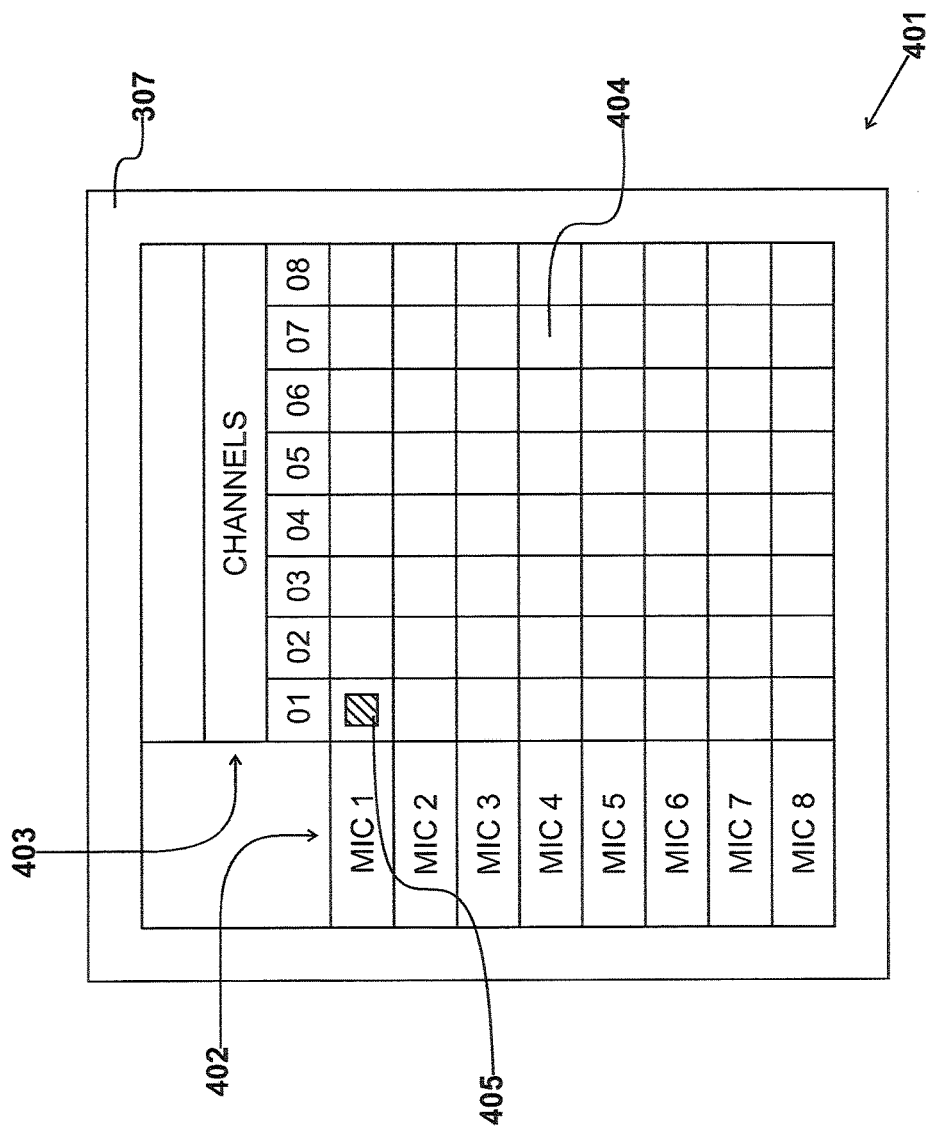
FIG. 4 shows the display of a connection-interface on a touch-screen identified in FIG. 3.

When implementing an embodiment of the present invention, the second-touch-screen 307 displays a connection-interface 401, as illustrated in FIG. 4.

In an embodiment, the connection-interface 401 takes the form of a matrix, in which available input devices are identified in a matrix-column 402 and available channels are identified within a matrix-row 403. Each channel 01 to 08 is assigned to a channel-strip 302 and the channels, effectively at the third node, represent an input, from the digital-audio-interface 103, into the digital-signal-processing-system 102.

The matrix-column 402 identifies input devices, such as microphone 105, connected to the analog-inputs 107 of the audio-digitizing-system 106. In this example, the inputs are identified as MIC 1 to MIC 8. Thus, in this example, eight microphone inputs are being considered but an input from a stage box could include significantly more inputs and inputs could be obtained from alternative sources, such as musical instruments etc.

The connection-interface 401 also includes a selection-region 404, that allows connections to be made from an external audio-source to channels within the digital-signal-processing-system 102. In an embodiment, a connection is established by a user manually selecting an appropriate coordinate position within the selection-region 404. As illustrated in the example, the coordinate position representing MIC 1 being connected to channel 01 has been selected, resulting in a change to the display as indicated at position 405.

In an embodiment, applying pressure again at this location results in the connection being unmade; such that, the display-position 405 and all of the other display-positions operate in a toggle-like fashion. However, upon making a connection, such as that indicated by display-position 405 no further action is required on the part of the operative and operations performed in order to establish the connection, in accordance with an embodiment of the invention, will be controlled exclusively by the control-processor 110.

FIG. 5

Figure 5:
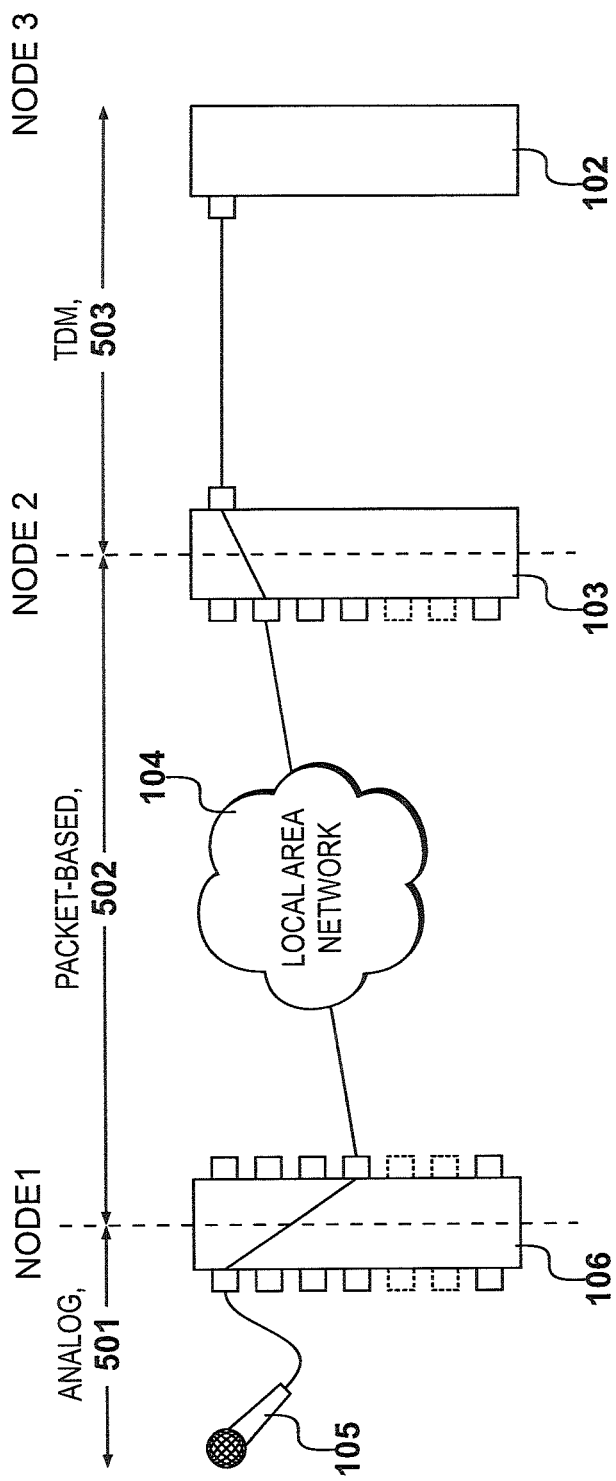
FIG. 5 shows a schematic representation of the environment of FIG. 1.

A schematic representation of the environment of FIG. 1 is illustrated in FIG. 5, emphasising inventive aspects of the present invention. The audio-source 105 is shown in the analog domain, illustrated by a first-stage 501. A second-stage 502 exists in the digital domain, implemented in a packet-based system. A third-stage 503 also exists in the digital domain but on this occasion it is represented by a time-division-multiplex environment. Thus, in order to provide connection between the audio-source 105 and the digital-signal-processing-system 102, it is necessary to establish a first-connection-node (node 1) between the analog-environment 501 and the packet-based environment 502. In addition, it is necessary to create a second-connection-node (node 2) between the packet-based environment 502 and the digital-audio-interface working in the time-division-multiplex environment 503. Finally, a third-connection-node (node 3) is required between the digital audio interface and the digital-signal-processing-system.

It should be appreciated that the analog inputs and channels within the time-division-multiplex environment are physical channels. However, the channels distributed within the packet-based environment 502 are not physical channels but are instead logical channels, only limited in their total number by the bandwidth of the local-area-network 104. Thus, the local-area-network 104 could be implemented using gigabit Ethernet or, in an alternative embodiment, it could use ten gigabit infrastructure. Thus, many transmission channels may be made available, by which audio is sent by the local-area-network 104.

At node 2, the digital-audio-interface 103 also has many logical channels for interfacing with the packet-based environment 502. Reception of audio from a transmission channel is achieved by allocating one of a plurality of logical reception channels which, in an embodiment of the invention, is implemented in response to commands received from the control-processor 110.

Within the digital-audio-interface 103, conversion takes place from packet-based encapsulation so that it is then possible to route digital-audio-signals into the time-division-multiplex environment 503. Within this data-stream, a succession of frames are provided, each of which includes a plurality of channels, as described with reference to FIG. 1. In an embodiment, two hundred and fifty-six audio channels are made available in this environment. The third node is then responsible for selecting a channel or channels from this multiplex and allocating channels 01 to 08 for example that are processed by the digital-signal-processing-system 102.

FIG. 6

Figure 6:
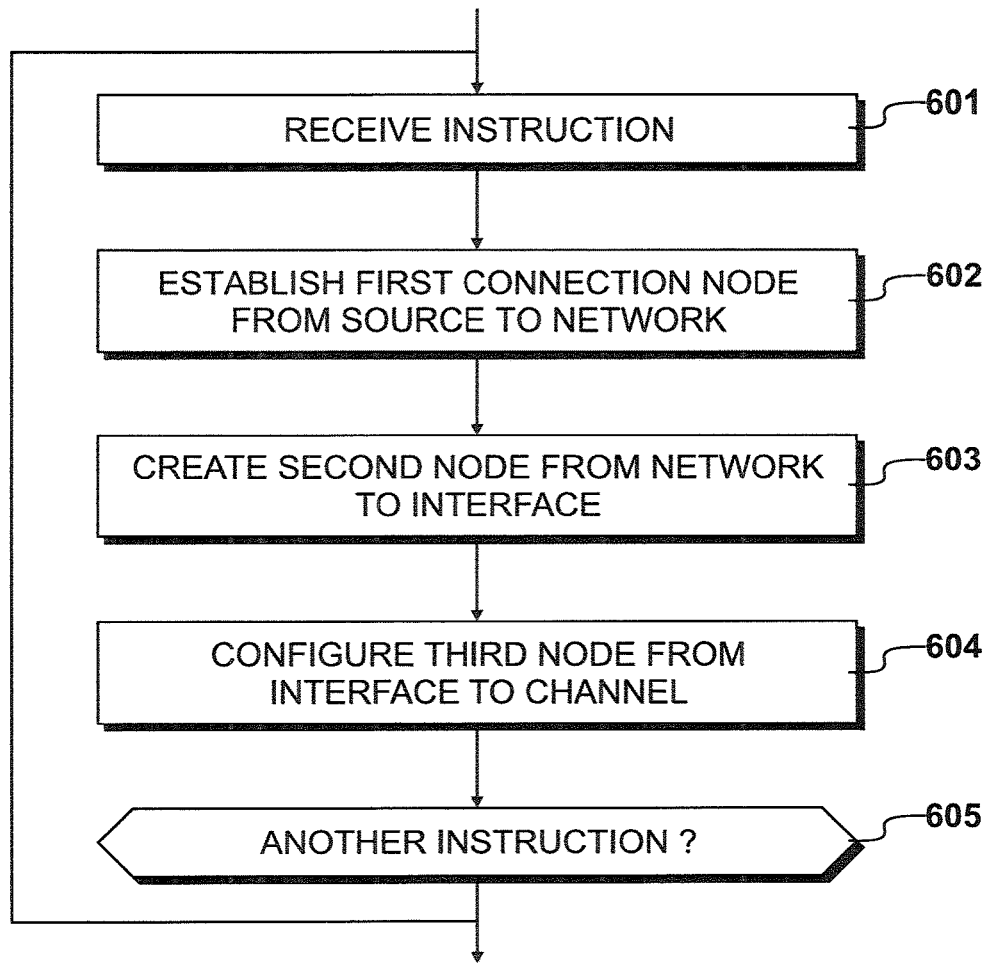
FIG. 6 identifies steps performed by a control processor identified in FIG. 1.
Figure 10:
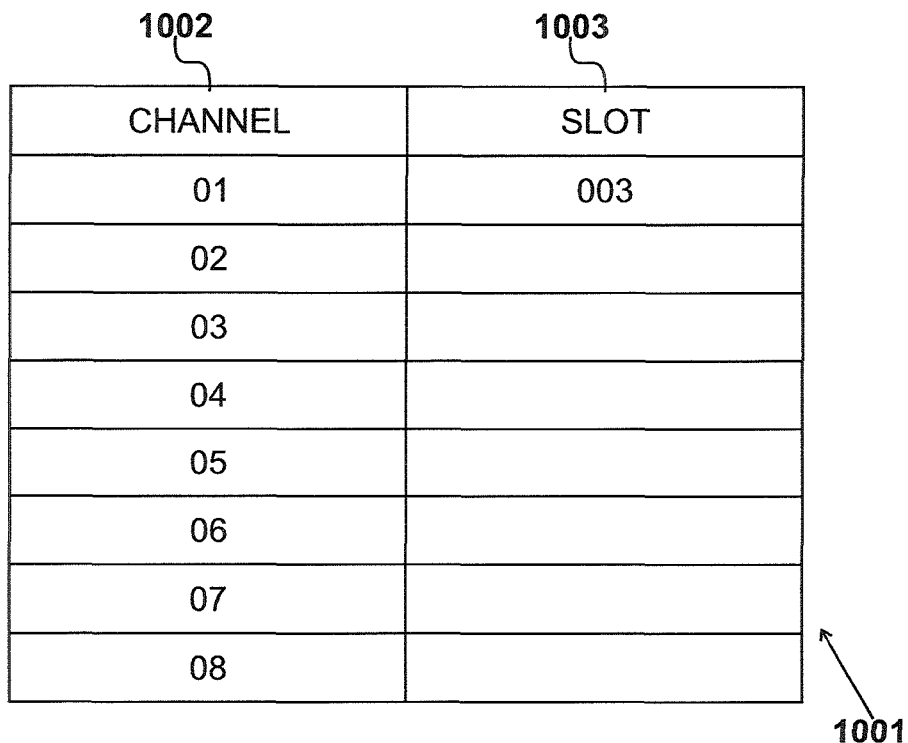
FIG. 10 shows a fourth-table.

Procedures performed by the control-processor 110 are illustrated in FIG. 6. At step 601 an instruction is received. In an embodiment, this instruction is received in response to a manual selection within selection-region 404, as described with reference to FIG. 4. Thus, an instruction is received at step 601 when display position 405 is activated.

At step 602 a first-connection-node is established from the audio-source 105 to the packet-based-network 104.

At step 603 a second-node is created from the packet-based network 104 to the digital-audio-interface 103. Thereafter, at step 604, a third node is configured from the digital-audio-interface 103 to the digital-signal-processing-system 102. At step 605, it is asked whether there is another instruction. If yes, the process returns to step 601. If no, the process ends.

FIG. 7

In an embodiment, the control-processor 110 maintains a first-table 701 identifying attributes of the external devices. Thus, a first-column 702 identifies each of the external devices and a second-column 703 identifies specific attributes for these external devices. In this example, each microphone may produce a high impedance output or a low impedance output. In addition, each microphone may require a forty-eight volt phantom power or may operate without external power. In this example, MIC 1 and MIC 2 both present high impedance outputs and require a forty-eight volt phantom power supply. MIC 3 to MIC 8 present a low impedance outputs and do not require phantom power.

As shown in FIG. 7, headphones are also connected to the audio-digitizing-system 106 and are identified as phones 1 to phones 8. These do not have attributes that may be controlled locally.

The controls identified in the second column 703 are operated within the digital-signal-processing-system 102. Control back to the audio-digitizing-system 106 is provided by the second-control-line 114, the third-control-line 115, the packet-based network 104 and the fourth-control-line 116.

In this embodiment, the second-data-line 118 is shown as providing two-way communication. Thus, in addition to receiving audio signals from the audio-digitizing-system 106, it is possible to return audio signals back to the audio-digitizing-system 106 such that these become available to audio-outputs 108.

FIG. 8

In this example, the activation of display-position 405 results in the generation of an instruction requiring the audio-source 105 to be connected to channel 1 of the digital-signal-processing-system 102. At the control-processor 110, a table 801 is maintained identifying possible addresses, in a third-column 802 that may be selected by the audio-digitizing-system 106 for transmissions through the packet-based-network 104. In an embodiment, when a new instruction is received, the control-processor 110 identifies the next available address.

In the second-table 801, a fourth-column 803 records details of a particular device and a fifth-column 804 confirms whether a device has been connected. Thus, in this embodiment, if a connection is identified as "yes" the address is in use and cannot be selected. Alternatively, if the entry is identified as "no" the address is not in use and may be selected. Thus, when MIC 1 is selected, addresses 0001 to 0007 are already in use. Consequently, the next available address is 0008 which is then selected for MIC 1, resulting in an entry in the fifth-column 804 being updated with the designation "yes".

In this example, having connected MIC 1, phones 1 are also connected in the reverse direction. Thus, on the next interaction, address 0009 is selected for phones 1, resulting in an update to the fifth-column 804. Thus, upon receiving the next instruction, address 0010 would be selected. However, in an embodiment, should any of the lower addresses be disconnected prior to receiving the next instruction, these returned addresses will be selected in preference to extending the address space. Thus, for example, if address 0004 becomes available, this will be selected in preference to address 0010. Thus, reference is made to the second-table 801 when establishing the first-connection-node as required at step 602.

FIG. 9

A third-table 901 is maintained by the control-processor 110 identifying available internal time-division-multiplex slots at node 2. That is, time-division-multiplex-slots available to the digital-audio-interface 103.

A sixth-column 902 identifies TDM slots as 001 to 256. Having established a first-connection-node, as described with reference to FIG. 8, the digital-audio-interface 103 receives a command from the control-processor 110 to accommodate packets of audio data identifying address 0008. In response to receiving this command, the third-table 901 is consulted to identify the next available TDM slot. For the purposes of this example, as shown in FIG. 9, TDM slots 001 and 002 are identified as being in use. Thus, the next available TDM slot is 003. Thus, a second-node is created by interfacing packets identifying address 0008 onto TDM slot 003.

Similarly, upon receiving a further request, possibly identifying address 0010, this will be accommodated by allocating TDM slot 004.

At this stage, the first-connection-node has been established so that audio signals from the audio-source 105 will be encapsulated in packets identifying address 0008.

The second-node has been created by informing the digital-audio-interface 103 to expect packets identifying address 0008. Furthermore, these packets are to be converted from the packet-based environment to the time-division-multiplex environment by allocating them to TDM timeslot 003.

FIG. 10

In this example, the digital-signal-processing-system 102 provides controls for eight channels. The control-processor 110 maintains a fourth-table 1001 showing the allocation of these channels 01 to 08. The channels are identified in an eighth-column 1002 and a time-slot allocated to them is identified in a ninth-column 1003.

In response to receiving an instruction, audio-signals from the audio-source 105 are now allocated to TDM time-slot 0003 in a multiplex generated by the digital-audio-interface 103.

In the originating instruction, as defined by the interface described with reference to FIG. 4, the user has specifically stated that audio-source 105 should be connected to manually controlled channel 01. Upon reviewing the fourth-table 1001, the control-processor 1101 may find that channel 01 has already been allocated. However, on this occasion, the new instruction take takes priority and therefore, as illustrated in the fourth-table 1001, TDM slot 003 is allocated to channel 01. Consequently, the third node has been configured and audio data received at the third node within time-slot 003 will be allocated to controlled channel 01.

Upon completing the configuration of the third node, it is now possible for fader 303 to control the level of audio signals received from audio-source 105. In addition, audio-source 106 may be controlled by operation of appropriate selections upon the control-surface 301. The user experiences a seamless connection operation. However, by deploying aspects of the present invention, a sophisticated routing path has been established from the analog domain, to a packet-based domain, to a TDM multiplex and finally to a digital channel under the control of the control-processor 110.

The invention claimed is:

1. A machine for processing audio signals, comprising:
a real-time digital-signal-processing system;
a digital-audio-interface arranged to be connected to a packet-based-network;
a control-processor arranged to present a graphical-interface to a user; and
an external-audio-source connected to said packet-based-network, wherein:
said control-processor is configured to receive an instruction to connect said external-audio-source to said digital-signal-processing system via said packet-based-network; and
in response to receiving said instruction, said control-processor is arranged to:
establish a first-connection-node between said external-audio-source and said packet-based-network;
create a second-connection-node between said packet-based-network and said digital-audio-interface; and
configure a third-connection-node between said digital-audio-interface and said digital-signal-processing system;
wherein:
said digital-audio-interface is configured to receive data-packets from a plurality of sources, in which each said source appends a respective packet-address to each transmitted data packet; and
each packet with a similar packet address is located within a respective time-slot following the creation of a respective second-connection-node.

2. The machine of claim 1, wherein said digital-signal-processing system is implemented on a programmable system running a real-time operating system.

3. The machine of claim 1, wherein:
said digital-signal-processing system defines a plurality of individually controllable audio channels; and
said third-connection-node is configured to identify one of said audio channels.

4. The machine of claim 3, wherein said audio channels are controlled within an audio mixing console arranged to process, route and mix audio signals.

5. The machine of claim 4, wherein a selected audio-channel of said mixing console is specified in said instruction.

6. The machine of claim 1, wherein:
said control processor identifies a first-packet-address when a first-connection-node is established.

7. The machine of claim 1, wherein said control processor is configured to relay details of a first-packet-address to said digital-audio-interface during the creation of said second-connection-node.

8. The machine of claim 1, wherein said control-processor is also configured to transmit audio signals from said digital-signal-processing system back to said external-audio-source.

9. The machine of claim 1, wherein said control-processor is configured to:
maintain details of audio-source functionality;
establish records of current audio connections; and
convey control signals to said external-audio-source.

10. A process operable upon audio signals, comprising the steps of:
receiving an instruction via a graphical interface to connect an external audio-source to a channel of a digital-signal-processing system;
establishing a first-connection-node between said audio-source and a packet-based network;
creating a second-connection-node between said packet-based-network and a digital-audio-interface configured to convert packet-based data into a time-division-multiplex data;
configuring a third connection-node between a location in said time-division-multiplex data of said digital audio-interface and a channel of said digital-signal-processing system; and
configuring said digital-audio-interface to receive data-packets from a plurality of sources, in which each said source appends a respective packet-address to each transmitted data packet; and
wherein each packet with a similar packet address is located within a respective time-slot following the creation of a respective second-connection-node.

11. The process of claim 10, wherein said configuring step identifies a channel of said digital-signal-processing system.

12. The process of claim 10, wherein said establishing step allocates an address for data-packets transmitted over said packet-based-network.

13. The process of claim 10, including the step of transmitting audio data from the digital-signal-processing system back through said packet-based network.

14. The process of claim 10, wherein control signals are conveyed back to said audio-source.

15. A process to establish an audio environment, comprising the steps of:
connecting a real-time digital-signal-processing system to a digital-audio-interface that is in turn connected to a packet-based network;
controlling said digital-signal-processing system and said digital-audio-interface from a control-processor arranged to present a graphical-interface to a user;
connecting an external audio-source to said packet-based-network, in response to receiving an instruction via said graphical-interface, and
said control processor:
establishes a first-connection-node between said audio-source and said packet-based-network;
creates a second-connection-node between said packet-based-network and said digital-audio-interface; and
configures a third-connection-node between said digital-audio-interface and said digital-signal-processing system;
configuring said digital-audio-interface to receive data-packets from a plurality of sources, in which each said source appends a respective packet-address to each transmitted data packet; and
wherein each packet with a similar packet address is located within a respective time-slot following the creation of a respective second-connection-node.

16. The manufacture of claim 15, wherein said digital-signal-processing system is implemented on a computer system running a real-time operating system.

17. The manufacture of claim 15, wherein said digital-signal-processing system provides the functionality of a mixing console.

18. The manufacture of claim 17, wherein said audio-source includes a microphone and an analog-to-digital converter for producing a stream of data packets.

19. The manufacture of claim 18, wherein:
said audio-source includes an analog amplifier with input controls for signal gain and an application of phantom power; and
said input controls are controlled from said mixing console.

* * * * *